(12) United States Patent  
Sandhu et al.

(10) Patent No.: US 7,279,041 B2
(45) Date of Patent: *Oct. 9, 2007

(54) ATOMIC LAYER DEPOSITION METHODS AND ATOMIC LAYER DEPOSITION TOOLS

(75) Inventors: Gurtej S. Sandhu, Boise, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

This patent is subject to a terminal disclaimer.

(21) Appl. No.: 11/170,809

(22) Filed: Jun. 30, 2005

(65) Prior Publication Data

US 2005/0245093 A1     Nov. 3, 2005

Related U.S. Application Data

(63) Continuation of application No. 10/267,467, filed on Oct. 8, 2002, now Pat. No. 6,916,374.

(51) Int. Cl.
*C30B 21/06*     (2006.01)

(52) U.S. Cl. .................. 117/89; 117/101; 117/105; 117/108; 117/109; 118/715; 118/716

(58) Field of Classification Search .............. 117/105, 117/89, 101, 108, 109; 118/715, 716
See application file for complete search history.

(56) References Cited

U.S. PATENT DOCUMENTS

| | | | |
|---|---|---|---|
| 5,788,447 | A | 8/1998 | Yonemitsu et al. |
| 5,855,675 | A | 1/1999 | Doering et al. |
| 5,879,459 | A | 3/1999 | Gadgil et al. |
| 6,066,210 | A | 5/2000 | Yonemitsu et al. |
| 6,143,083 | A | 11/2000 | Yonemitsu et al. |
| 6,174,377 | B1 | 1/2001 | Doering et al. |
| 6,355,561 | B1 | 3/2002 | Sandhu et al. |
| 6,420,230 | B1 | 7/2002 | Derderian et al. |
| 6,458,416 | B1 | 10/2002 | Derderian et al. |
| 6,534,357 | B1 | 3/2003 | Basceri et al. |
| 6,541,353 | B1 | 4/2003 | Sandhu et al. |
| 6,551,399 | B1 | 4/2003 | Sneh et al. |
| 6,551,893 | B1 | 4/2003 | Zheng et al. |
| 6,559,472 | B2 | 5/2003 | Sandhu et al. |
| 6,596,583 | B2 | 7/2003 | Agarwal et al. |

(Continued)

OTHER PUBLICATIONS

U.S. Appl. No. 03/30732, filed Sep. 26, 2003, PCT Search Report.
U.S. Appl. No. 03/30732, filed Sep. 26, 2003, PCT IPER.

*Primary Examiner*—Robert Kunemund
(74) *Attorney, Agent, or Firm*—Wells St. John P.S.

(57) ABSTRACT

An atomic layer deposition method includes positioning a plurality of semiconductor wafers into an atomic layer deposition chamber. Deposition precursor is emitted from individual gas inlets associated with individual of the wafers received within the chamber effective to form a respective monolayer onto said individual wafers received within the chamber. After forming the monolayer, purge gas is emitted from individual gas inlets associated with individual of the wafers received within the chamber. An atomic layer deposition tool includes a subatmospheric load chamber, a subatmospheric transfer chamber and a plurality of atomic layer deposition chambers. Other aspects and implementations are disclosed.

39 Claims, 6 Drawing Sheets

U.S. PATENT DOCUMENTS

| | | |
|---|---|---|
| 6,596,636 B2 | 7/2003 | Sandhu et al. |
| 6,613,587 B1 | 9/2003 | Carpenter et al. |
| 6,620,253 B1 | 9/2003 | Dando et al. |
| 6,627,260 B2 | 9/2003 | Derderian et al. |
| 6,653,154 B2 | 11/2003 | Doan et al. |
| 6,673,701 B1 | 1/2004 | Marsh et al. |
| 6,689,624 B2 | 2/2004 | Doan et al. |
| 6,730,367 B2 | 5/2004 | Sandhu |
| 6,743,736 B2 | 6/2004 | Mardian et al. |
| 6,746,934 B2 | 6/2004 | Sandhu et al. |
| 6,753,271 B2 | 6/2004 | Sarigiannis et al. |
| 6,765,178 B2 | 7/2004 | Shang et al. |
| 6,765,250 B2 | 7/2004 | Doan et al. |
| 6,787,185 B2 | 9/2004 | Derderian et al. |
| 6,787,373 B2 | 9/2004 | Dando et al. |
| 6,787,463 B2 | 9/2004 | Mardian et al. |
| 2001/0011526 A1 | 8/2001 | Doering |
| 2002/0037630 A1 | 3/2002 | Agarwal et al. |
| 2002/0047151 A1 | 4/2002 | Kim et al. |
| 2002/0055235 A1 | 5/2002 | Agarwal et al. |
| 2002/0100418 A1 | 8/2002 | Sandhu et al. |
| 2002/0108714 A1 | 8/2002 | Doering et al. |
| 2002/0195056 A1 | 12/2002 | Sandhu et al. |
| 2003/0001190 A1 | 1/2003 | Basceri et al. |
| 2003/0003697 A1 | 1/2003 | Agarwal et al. |
| 2003/0207593 A1 | 11/2003 | Derderian et al. |
| 2004/0040502 A1 | 3/2004 | Basceri et al. |
| 2004/0040503 A1 | 3/2004 | Basceri et al. |
| 2004/0058491 A1 | 3/2004 | Basceri et al. |

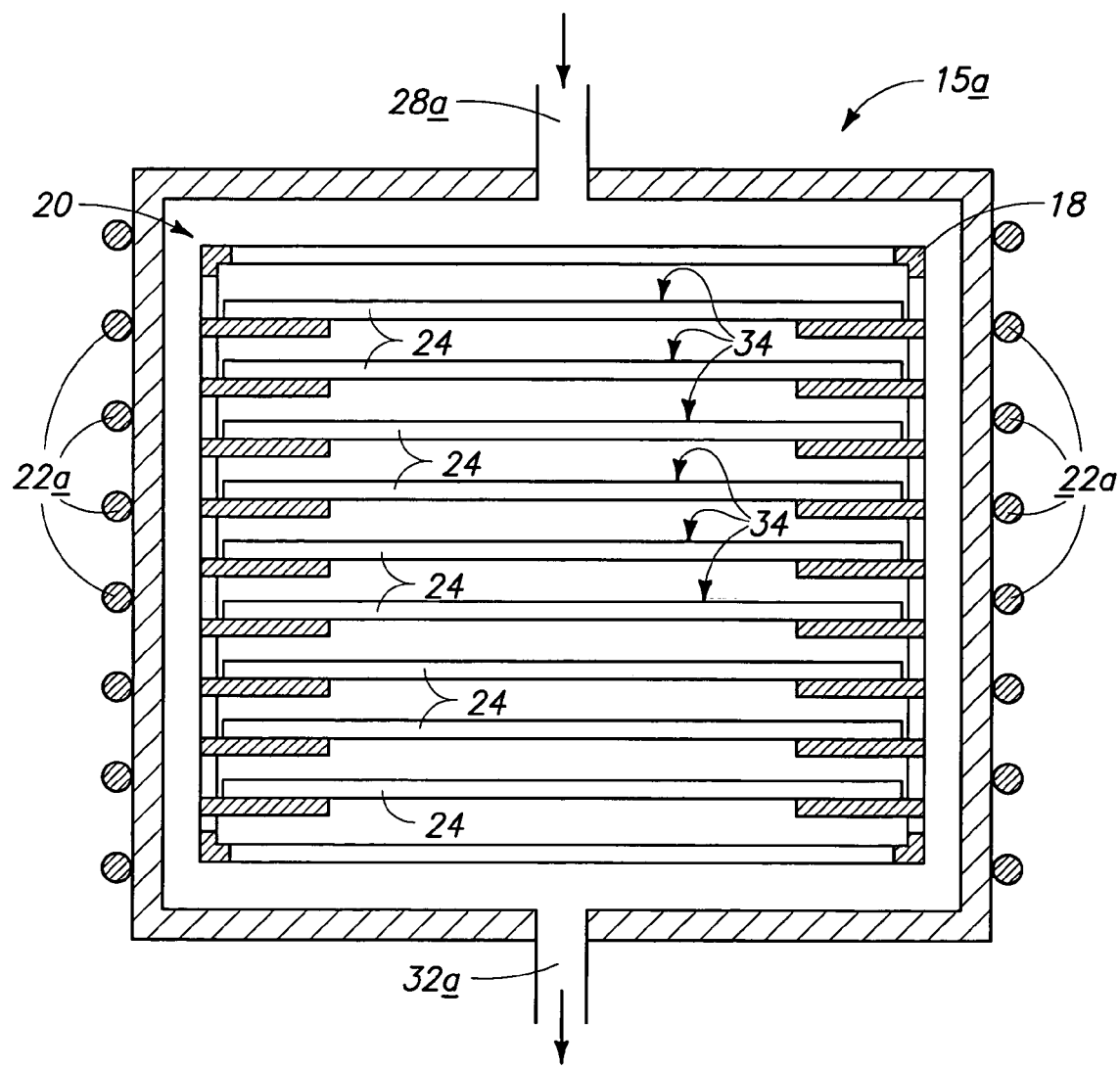

ATOMIC LAYER DEPOSITION METHODS AND ATOMIC LAYER DEPOSITION TOOLS

RELATED PATENT DATA

This patent resulted from a continuation application of U.S. patent application Ser. No. 10/267,467, filed Oct. 8, 2002 now U.S. Pat. No. 6,916,374, entitled "Atomic Layer Deposition Methods and Atomic Layer Deposition Tools", naming Gurtej S. Sandhu and Trung Tri Doan as inventors, the disclosure of which is incorporated by reference.

TECHNICAL FIELD

This invention relates to atomic layer deposition methods and to atomic layer deposition tools.

BACKGROUND OF THE INVENTION

Semiconductor processing in the fabrication of integrated circuitry typically includes the deposition of layers on semiconductor substrates. One such method is atomic layer deposition (ALD), which involves the deposition of successive monolayers over a substrate within a deposition chamber typically maintained at subatmospheric pressure. With typical ALD, successive monoatomic layers are adsorbed to a substrate and/or reacted with the outer layer on the substrate, typically by the successive feeding of different deposition precursors to the substrate surface.

An exemplary ALD method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor deposition precursor, different from the first, is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

Present ALD tools and methods include both single wafer depositions and multiple wafer depositions. Single wafer ALD systems suffer from inherent limitations of throughput due to slow deposition rate of the process and in single wafer processing. Multiple wafer depositions employ furnace-type tools which typically retain 200 or more wafers therein for deposition. Accordingly, such have very large reactor volumes typically requiring very long deposition precursor pulse times, as well as purge gas pulse times, which can negate a significant part of the throughput gain in processing multiple wafers at a time. Further, such large reactor volumes create inherent cleaning problems and short cleaning intervals to prevent the peeling of material from the sidewalls of the furnaces which can deposit on the wafers.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification, or the drawings), and in accordance with the doctrine of equivalents.

SUMMARY

The invention includes atomic layer deposition methods and atomic layer deposition tools. In one implementation, an atomic layer deposition method includes providing a cluster processing tool having a subatmospheric transfer chamber, a subatmospheric load chamber connected with the transfer chamber, and a plurality of subatmospheric atomic layer deposition chambers connected with the transfer chamber. A plurality of semiconductor wafers are placed onto a wafer carrier and the wafer carrier is provided within the load chamber. The wafer carrier with wafers thereon is moved from the load chamber into the transfer chamber. The wafer carrier with wafers thereon is moved from the transfer chamber and into one of the atomic layer deposition chambers. A material is atomic layer deposited onto the individual wafers received by the wafer carrier within the one atomic layer deposition chamber.

In one implementation, an atomic layer deposition method includes positioning a plurality of semiconductor wafers into an atomic layer deposition chamber. Deposition precursor is emitted from individual gas inlets associated with individual of the wafers received within the chamber effective to form a respective monolayer onto said individual wafers received within the chamber. After forming the monolayer, purge gas is emitted from individual gas inlets associated with individual of the wafers received within the chamber.

In one implementation, an atomic layer deposition tool includes a subatmospheric load chamber configured to receive a wafer carrier holding a plurality of semiconductor wafers. A subatmospheric transfer chamber is connected with the load chamber and configured to receive the wafer carrier holding the plurality of semiconductor wafers. A plurality of subatmospheric atomic layer deposition chambers are connected with the transfer chamber and respectively individually configured to receive the wafer carrier holding the plurality of semiconductor wafers for collectively atomic layer depositing onto individual of said wafers.

In one implementation, an atomic layer deposition tool includes a deposition chamber configured to receive a plurality of semiconductor wafers in a batch. A plurality of deposition precursor inlets are received within the chamber. Individual of the deposition precursor inlets are associated with respective individual of the wafers as received within the deposition chamber.

Other aspects and implementations are contemplated.

BRIEF DESCRIPTION OF THE DRAWINGS

Preferred embodiments of the invention are described below with reference to the following accompanying drawings.

FIG. 8 is an alternate embodiment to that depicted by FIG. 3, and is a diagrammatic sectional view as would be taken positionally through line 3-3 in FIG. 1 for such alternate embodiment.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
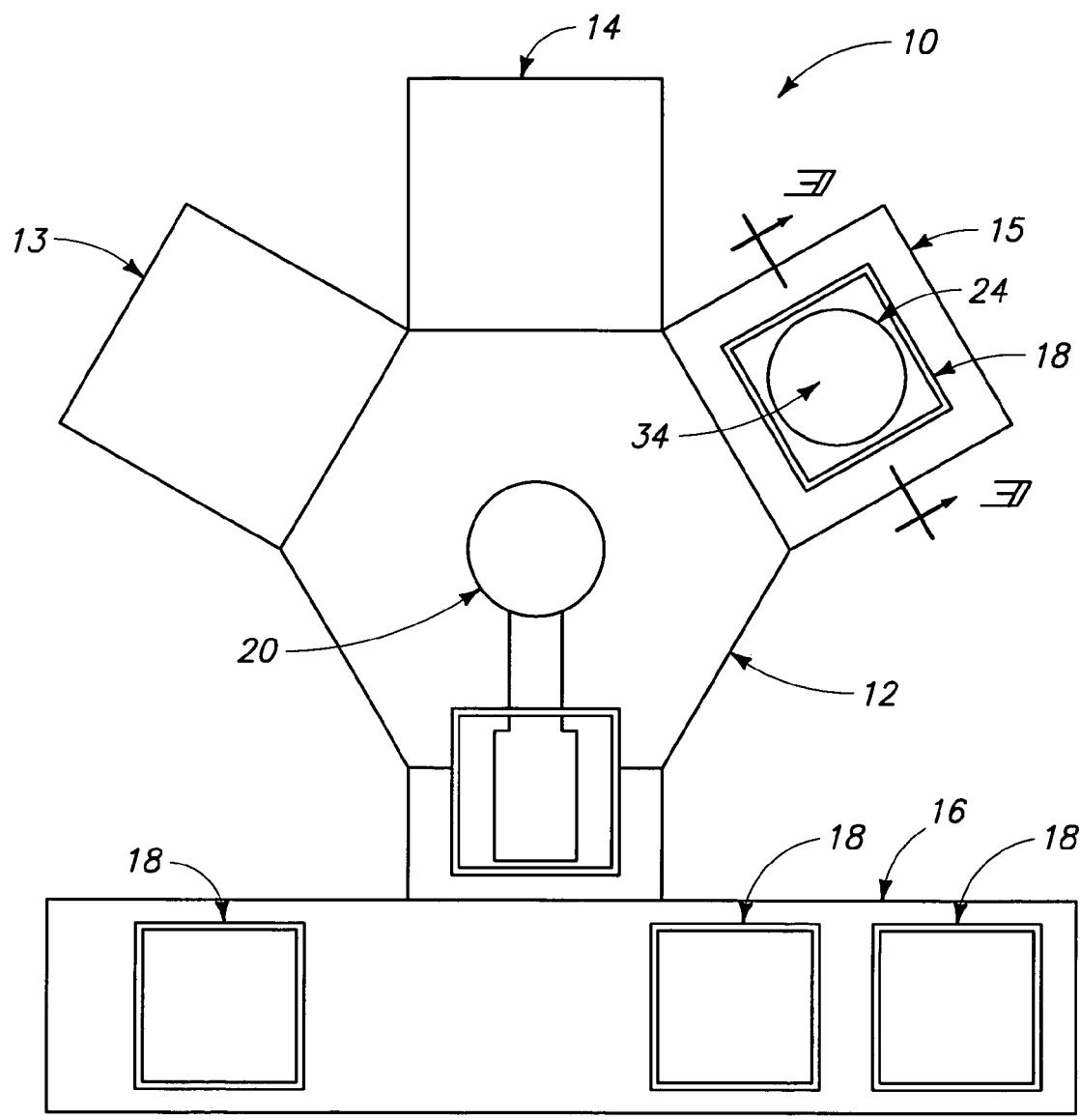
FIG. 1 is a diagrammatic top plan view of an atomic layer deposition tool in accordance with an aspect of the invention.

Referring to FIG. 1, an atomic layer deposition tool configured in accordance with an aspect of the invention is indicated generally with reference numeral 10. Preferred embodiment tool 10 is in the form of a cluster processing tool having a subatmospheric transfer chamber 12 and a plurality of subatmospheric atomic layer deposition chambers 13, 14 and 15 connected therewith. A subatmospheric load chamber 16 is also provided in connection with transfer chamber 12.

Figure 2:
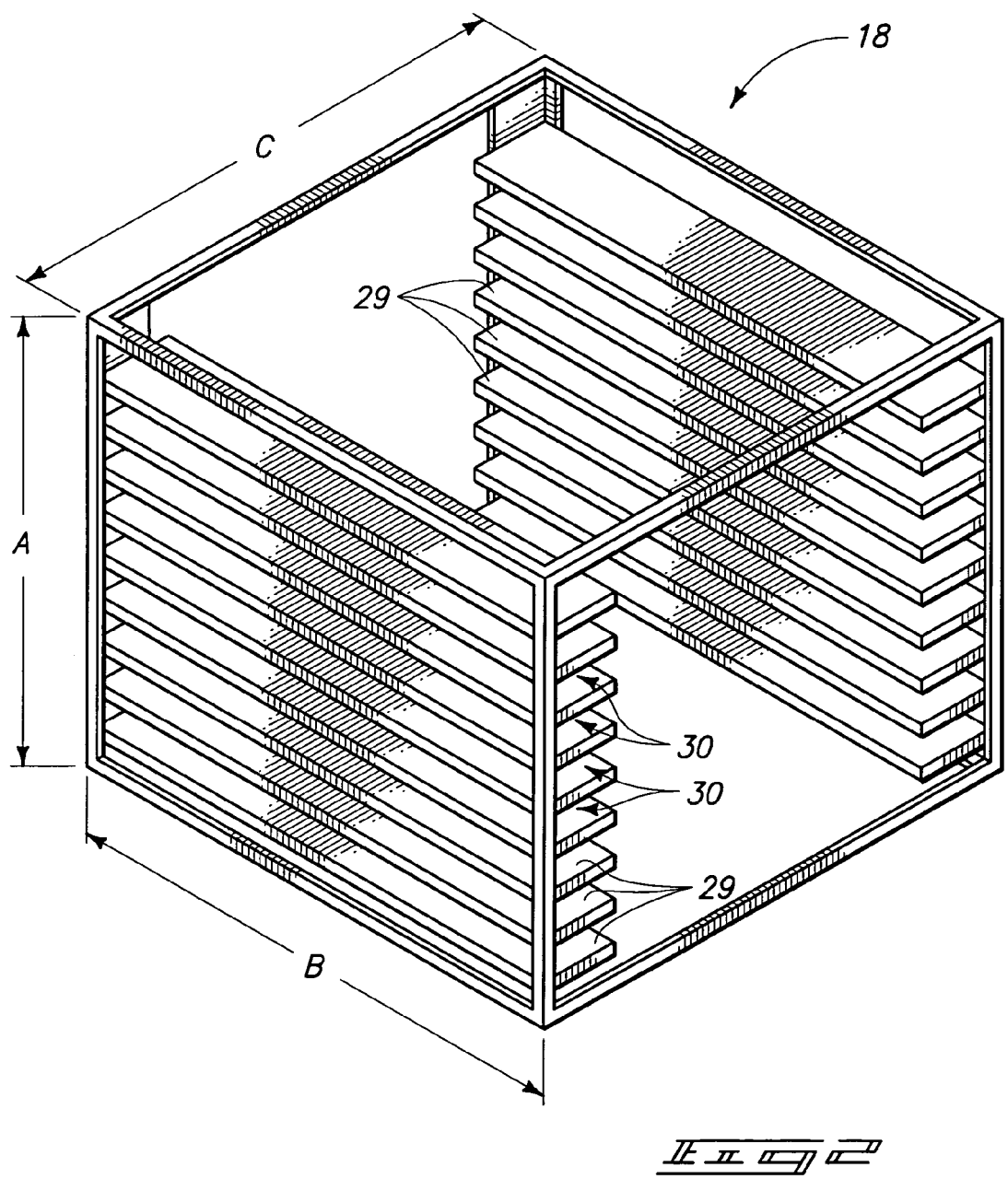
FIG. 2 is a perspective view of a wafer carrier usable in accordance with aspects of the invention.

FIG. 2 depicts an exemplary wafer carrier 18 usable in accordance with certain aspects of the invention. Preferred embodiment wafer carrier 18 is depicted in the form of a largely hollow cube-like structure having a plurality of supports 29 which define a plurality of wafer slots 30 adapted for individually receiving one of a plurality of wafers internally of the depicted cube volume. Wafer carrier 18 will typically also be deposited upon within the various processing chambers when depositing occurs on wafers received thereby. Preferably, carrier 18 is made of a material having a very low thermal coefficient of expansion to prevent material deposited thereon from flaking off. An exemplary preferred material is silicon carbide. Wafer carrier 18 is merely exemplary, and any possible wafer carrier, whether existing or yet-to-be developed, is contemplated in the various aspects of the invention. In one preferred embodiment, the wafer carrier is fabricated to hold no more than 200 wafers; in another embodiment, no more than 100 wafers; and in yet another embodiment, no more than 50 wafers. In a most preferred embodiment, the wafer carrier is configured to hold no more than 25 wafers, with from 20 to 25 wafers being but one preferred example.

In the illustrated preferred embodiment, the semiconductor wafers are held within the slots 30 and are entirely retained within the volume of the illustrated carrier. Alternately, of course, the wafers could project outwardly from the carrier. The illustrated wafer carrier with the plurality of wafers received thereby will occupy a loaded volume defined by a product of three maximum external linear dimensions of the carrier with the wafers which, in the illustrated preferred embodiments, would be the product of dimensions A, B and C. By way of example only, for a 25-wafer carrier for eight inch wafers, an exemplary product of A, B and C is 450 in$^3$.

Referring to FIG. 1, subatmospheric load chamber 16 of atomic layer deposition tool 10 is configured to receive a wafer carrier 18 holding a plurality of semiconductor wafers. The depicted preferred embodiment load chamber 16 is shown as having an internal volume sized to receive a plurality of such wafer carriers. Further, subatmospheric transfer chamber 12 is configured to receive a wafer carrier 18 holding the plurality of semiconductor wafers. Subatmospheric atomic layer deposition chambers 13, 14 and 15 are individually configured to receive a wafer carrier 18 holding the plurality of semiconductor wafers for collectively atomic layer depositing onto individual of such wafers within the respective chambers. A transfer robot 20 is diagrammatically shown for moving respective wafer carriers 18 from load chamber 16 into transfer chamber 12 and into and out of the respective atomic layer deposition chambers 13, 14 and 15.

Figure 3:
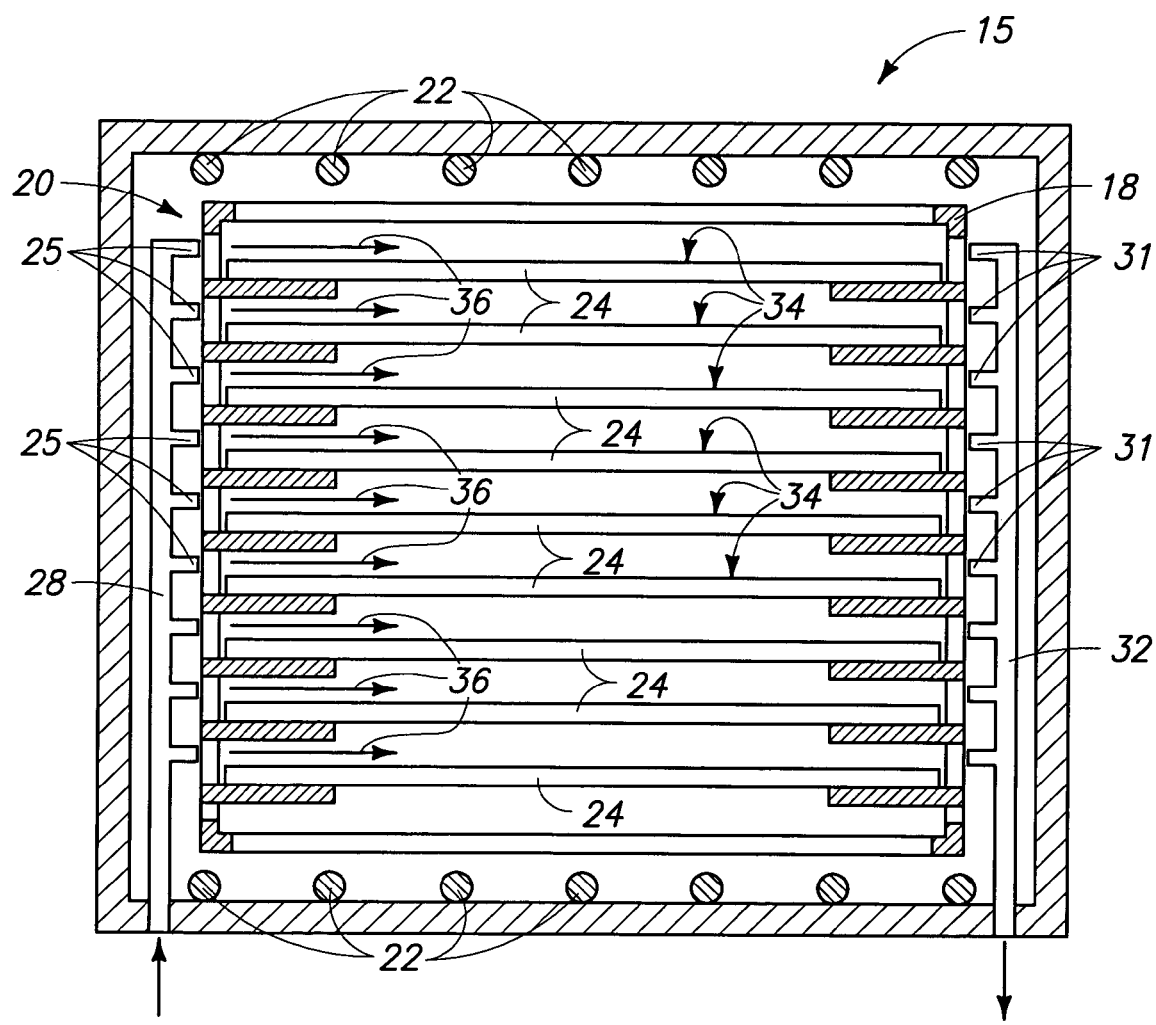
FIG. 3 is a diagrammatic sectional view as would be taken positionally through line 3-3 in FIG. 1.

Referring to FIG. 3, an internal volume 20 of an exemplary atomic layer deposition chamber 15 is diagrammatically depicted. Preferably, internal volume 20 is no greater than 125% of the loaded volume of carrier 18, and more preferably, no greater than 110% of such loaded volume. Preferably, the internal volumes of all the atomic layer deposition chambers of cluster processing tool 10 have these respective maximum volumes no greater than 125% or 110% of the loaded volume of carrier 18, and may be configured to have a common internal volume in terms of quantity. Exemplary temperature control coils 22, such as heater coils, are shown as received within internal volume 20 of chamber 15 for temperature control during deposition. Of course alternately, such coils could be received externally of the internal volume 20, partially or completely embedded within the chamber walls, or otherwise.

Individual deposition precursor gas inlets 25 are shown associated with respective individual wafers 24 received by carrier 18 and which is received for deposition processing within chamber 15. In one aspect, the invention contemplates an atomic layer deposition tool comprising a deposition chamber configured to receive a plurality of semiconductor wafers in a batch, wherein a plurality of deposition precursor inlets are included within the chamber, with individual of the deposition precursor inlets being associated with respective individual of the wafers as received within the deposition chamber. Therefore, such aspect is independent of any cluster processing tool aspects and methods associated therewith, and accordingly, is independent of constructions including load chambers and transfer chambers and regardless of whether any wafer carrier is utilized.

In the depicted and preferred embodiment, at least one individual deposition precursor gas inlet 25 is associated with each individual wafer 24 that is received within carrier 18 when carrier 18, loaded with wafers, is received within the atomic layer deposition chamber. Individual deposition precursor gas inlets 25 are diagrammatically shown as connecting through suitable piping 28 to externally of chamber 15 for connection with one or more suitable deposition precursor sources.

Individual deposition precursor gas outlets 31 are also shown in the preferred embodiment as being associated with respective individual wafers 24 received by carrier 18 when carrier 18 is received within the depicted atomic layer deposition chamber. Outlets 31 are shown connected to suitable piping 32 for exhausting precursor and other gases from the chamber.

As received by carrier 18, wafers 24 can be considered as having respective global deposition surfaces 34 within the chamber and over which desired material is deposited by atomic layer deposition. The depicted preferred embodiment individual gas inlets 25 are shown being configured to emit gas along respective lines 36 which are parallel to the respective global deposition surfaces 34.

In one implementation, individual gas inlets 25 are also configured to emit purge gas (i.e., through suitable piping and valving associated with piping 28). In one implementation, a different plurality of purge gas inlets, separate from the deposition precursor inlets, are associated with respective individual of the wafers received by the carrier when the carrier is received in the subject deposition chamber. Preferably as with the deposition precursor inlets, individual of the purge gas inlets are associated with the respective individual of the wafers as received within the deposition chamber.

Figure 4:
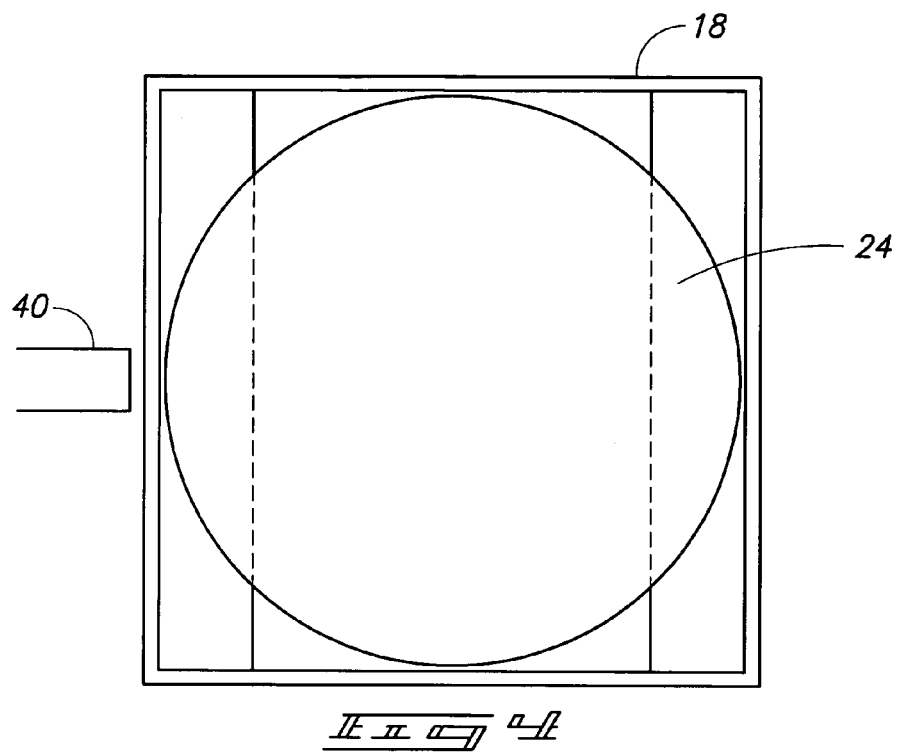
FIG. 4 is a diagrammatic top elevational plan view of an exemplary horizontal section taken through an atomic layer deposition chamber in accordance with an aspect of the invention.

By way of examples only, various exemplary embodiments are depicted diagrammatically with FIGS. 4-7. By way of examples only, each diagrammatically depicts, in horizontal section, one of wafers 24 retained by a carrier 18 within an atomic layer deposition chamber. FIG. 4 depicts a single deposition precursor inlet 40 associated with individual wafer 24. Such could be configured for emitting both deposition precursor and purge gas, for example as described above.

Figure 5:
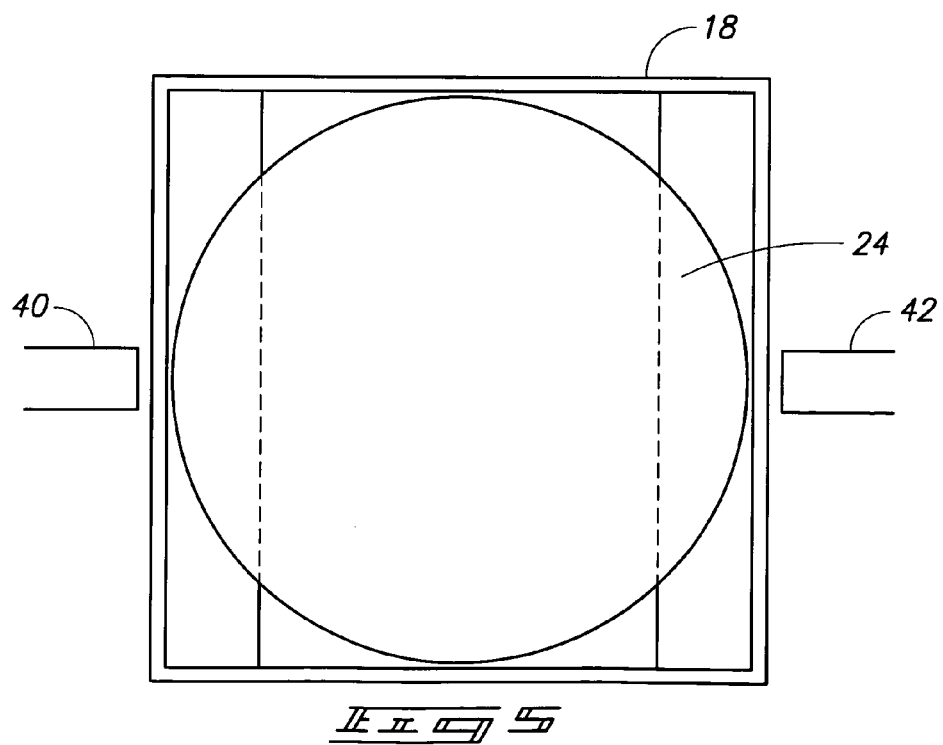
FIG. 5 is an alternate embodiment depiction of FIG. 4.

FIG. 5 depicts a deposition precursor inlet 40 and a purge gas inlet 42 associated with individual wafer 24, with such inlets being diagrammatically opposed across a respective individual wafer 24. Alternately by way of example only, each of inlets 40 and 42 could be configured for emitting both deposition precursor and purge gas as selected by the operator. Accordingly in one aspect, the invention contemplates the provision of a plurality of deposition precursor inlets associated with respective individual of the wafers when received within the chamber in a batch of wafers being processed.

Figure 6:
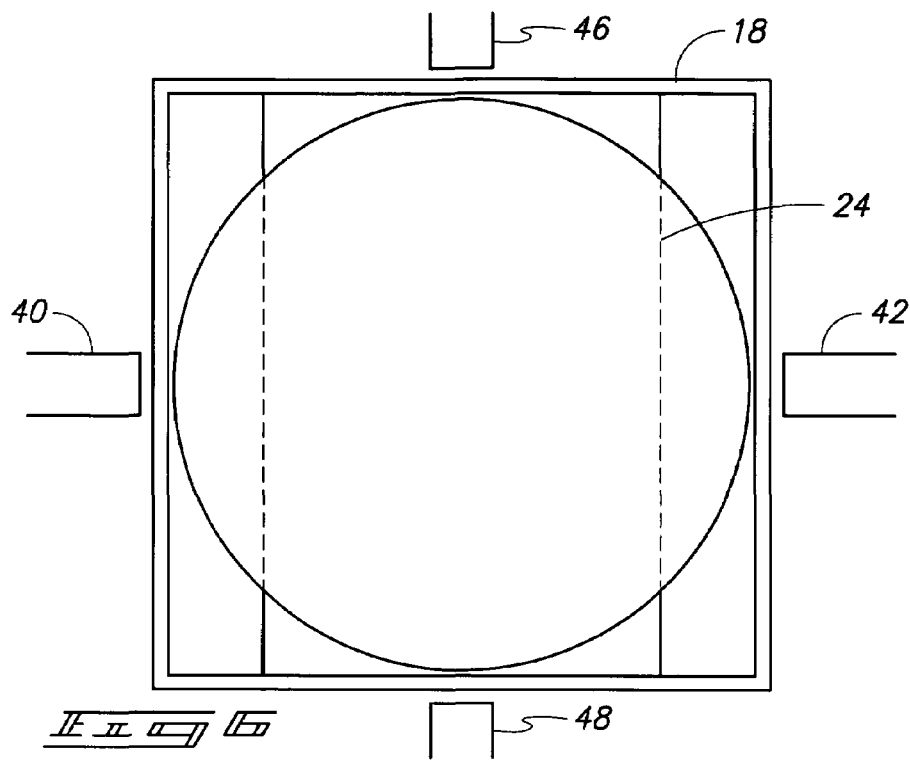
FIG. 6 is an alternate embodiment depiction of FIG. 4.

FIG. 6 depicts additional deposition precursor and/or purge gas inlets 46 and 48. In one implementation, precursor inlets 40, 42, 46 and 48 constitute a plurality of deposition precursor inlets which are equally spaced about the respective perimeters of the respective individual of the wafers 24 when received within the chamber in a batch of wafers being processed. Likewise, FIG. 5 can be considered as depicting a plurality of deposition precursor inlets 40 and 42 which are equally spaced about the respective perimeters of the respective individual of the wafers when received within the chamber for batch processing.

Figure 7:
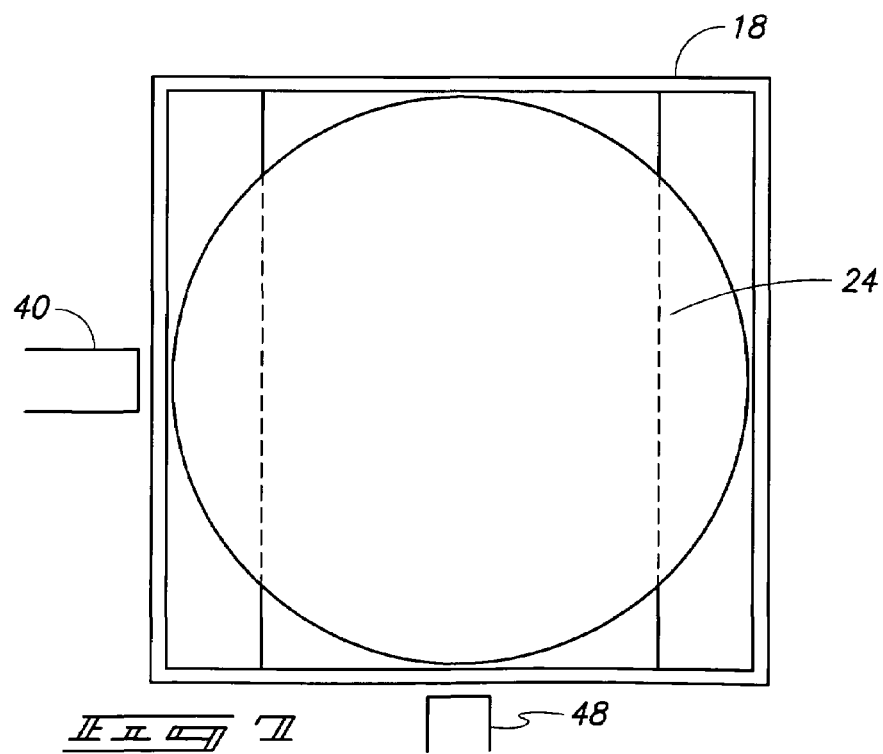
FIG. 7 is an alternate embodiment depiction of FIG. 4.

Further by way of example only, FIG. 7 depicts an alternate example comprising only two deposition precursor inlets 40 and 48, and which are not equally spaced about the depicted perimeter of wafers 24.

Further by way of example only and for example with respect to the FIG. 6 construction, inlets 40 and 42 could be plumbed specifically and only as deposition precursor inlets and inlets 46 and 48 could be specifically and only plumbed as purge gas inlets, whereby the purge gas inlets and the deposition precursor inlets alternate about the perimeter of the respective individual wafer.

By way of example only, an alternate embodiment atomic layer deposition chamber 15a usable in accordance with certain methodical aspects of the invention is shown in FIG. 8. Like numerals from the first described embodiment are utilized where appropriate, with differences being indicated with the suffix "a". Chamber 15a includes, by way of example only, externally received temperature control coils 22a which provide temperature control from the sides. Further, a precursor and/or inert gas inlet 28a introduces gas from the top, and an exhaust gas outlet 32a exhausts gas from the chamber.

Certain aspects of the invention include atomic layer deposition methods. The exemplary depicted and claimed apparatus enables practice of aspects of the invention in accordance with the method aspects. However, the methodical aspects of the invention are in no way limited by apparatus aspects unless literally included in the claims. Likewise, the tool/apparatus aspects of the invention are not limited by any methodical aspects unless literally claimed.

In accordance with one aspect of an atomic layer deposition method, a plurality of semiconductor wafers is placed onto a wafer carrier and the wafer carrier is provided within the load chamber. The placing of the plurality of the wafers onto the wafer carrier could occur within the load chamber, or externally thereof. Regardless, the wafer carrier with wafers thereon is moved from the load chamber into the transfer chamber. Further, the wafer carrier with wafers thereon is moved from the transfer chamber into one of the atomic layer deposition chambers of a cluster processing tool having a plurality of such atomic layer deposition chambers. A material is then atomic layer deposited onto the individual wafers received by the wafer carrier within the one atomic layer deposition chamber by any suitable existing or yet-to-be developed methods. Further, the invention preferably comprises placing another plurality of semiconductor wafers onto another wafer carrier and providing the another wafer carrier within the load chamber while conducting the above-described atomic layer depositing. Thereby, processing throughput can be maximized. In certain aspects of methodical features of the invention, the preferred atomic layer depositing emits deposition precursor from individual gas inlets, and emits purge gas from individual gas inlets, utilizing exemplary of the above or other atomic layer deposition equipment, whether existing or yet-to-be developed.

In one aspect, the invention contemplates deposition of material onto the wafer carrier. After a plurality of atomic layer depositings within the cluster processing as described above, for example, the invention contemplates cleaning the wafer carrier within an individual of the atomic layer deposition chambers. Typically and preferably, no wafers are received by the carrier during such cleaning.

After atomic layer depositing, certain methodical aspects of the invention further contemplate moving the carrier with wafers into the transfer chamber and into another of the atomic layer deposition chambers, and atomic layer depositing a material onto the individual wafers received by the wafer carrier within the another atomic layer deposition chamber. Of course, the materials deposited and the precursor and inert gases utilized in this or any aspect of the depositions can be the same or different from one another.

In accordance with one implementation, an atomic layer deposition method positions a plurality of semiconductor wafers into an atomic layer deposition chamber. Such a chamber can be an existing or a yet-to-be developed chamber, and independent of use of a cluster-type processing tool or any other tool utilizing load chambers and transfer chambers, and independent of use of a wafer carrier. Regardless, a deposition precursor is emitted from individual gas inlets associated with individual of the wafers received within the chamber effective to form a respective monolayer onto such individual wafers received within the chamber. After forming the monolayer, a purge gas is emitted from individual gas inlets associated with individual of the wafers received within the chamber. Any of the above-described processings and apparatuses associated therewith can be utilized as described above in each of the other embodiments. Typically, in a commercially viable atomic layer deposition, in accordance with an aspect of the invention, such a method will comprise conducting another deposition precursor emitting (the same or different from the first) effective to form another respective monolayer (the same or different as the first) onto the individual wafers received within the chamber, and conducting another purge gas emitting. Alternately considered, a successive deposition of monolayers is conducted to form a layer or layers of desired ultimate thickness.

By way of example only, methodical and apparatus aspects of the invention can be utilized to provide very fast atomic layer deposition cycles, and preferred laminar gas flows to the respective wafers for deposition and purging effect. Further in using a carrier loaded with wafers, minimizing the volume of the atomic layer deposition chambers can likewise minimize required deposition and purge gas pulse times.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method comprising:
   providing a cluster processing tool having a transfer chamber, a load chamber connected with the transfer chamber, and a plurality of deposition chambers connected with the transfer chamber;
   placing a plurality of semiconductor wafers onto a wafer carrier and providing the wafer carrier within the load chamber;
   moving the wafer carrier with wafers thereon from the load chamber into the transfer chamber;
   moving the wafer carrier with wafers thereon from the transfer chamber and into one of the deposition chambers; and
   atomic layer depositing a material onto the individual wafers received by the wafer carrier within the one deposition chamber.

2. The method of claim 1 wherein the placing of the plurality of wafers onto the wafer carrier occurs within the load chamber.

3. The method of claim 1 wherein the wafer carrier with the plurality of wafers received thereby occupies a loaded volume defined by a product of three maximum external linear dimensions of the carrier with the wafers, the one deposition chamber having an internal volume which is no greater than 125% of the loaded volume.

4. The method of claim 1 wherein the wafer carrier with the plurality of wafers received thereby occupies a loaded volume defined by a product of three maximum external linear dimensions of the carrier with the wafers, the one deposition chamber having an internal volume which is no greater than 110% of the loaded volume.

5. The method of claim 1 wherein the wafer carrier with the plurality of wafers received thereby occupies a loaded volume defined by a product of three maximum external linear dimensions of the carrier with the wafers, all of the deposition chambers having respective internal volumes which are no greater than 110% of the loaded volume.

6. The method of claim 1 wherein the wafer carrier with the plurality of wafers received thereby occupies a loaded volume defined by a product of three maximum external linear dimensions of the carrier with the wafers, all of the deposition chambers having a common internal volume which is no greater than 110% of the loaded volume.

7. The method of claim 1 wherein the plurality of wafers placed onto the wafer carrier is no greater than 200.

8. The method of claim 1 wherein the plurality of wafers placed onto the wafer carrier is no greater than 100.

9. The method of claim 1 wherein the plurality of wafers placed onto the wafer carrier is no greater than 50.

10. The method of claim 1 wherein the plurality of wafers placed onto the wafer carrier is from 20 to 25.

11. The method of claim 1 wherein,
    the wafer carrier with the plurality of wafers received thereby occupies a loaded volume defined by a product of three maximum external linear dimensions of the carrier with the wafers, the one deposition chamber having an internal volume which is no greater than 110% of the loaded volume; and
    the plurality of wafers placed onto the wafer carrier is no greater than 50.

12. The method of claim 1 further comprising while conducting the atomic layer depositing, placing another plurality of semiconductor wafers onto another wafer carrier and providing the another wafer carrier within the load chamber.

13. The method of claim 12 wherein the placing of the another plurality of wafers onto the another wafer carrier occurs within the load chamber.

14. The method of claim 1 further comprising after a plurality of atomic layer depositings within the cluster processing tool, cleaning the wafer carrier within an individual of the deposition chambers.

15. The method of claim 14 wherein no wafers are received by the carrier during the cleaning.

16. The method of claim 1 wherein the atomic layer depositing comprises emitting deposition precursor from individual gas inlets associated with respective individual of the wafers as received by the carrier within the one deposition chamber.

17. The method of claim 16 wherein the atomic layer depositing comprises emitting purge gas from said individual precursor gas inlets.

18. The method of claim 16 wherein the atomic layer depositing comprises emitting purge gas from different individual gas inlets associated with respective individual of the wafers as received by the carrier within the one deposition chamber.

19. The method of claim 16 wherein the emitting from the individual gas inlets is along respective lines which are parallel with respective global deposition surfaces of the respective individual wafers as received by the carrier within the one deposition chamber.

20. The method of claim 16 wherein the emitting is from at least one individual gas inlet associated with each individual wafer as received by the carrier within the one deposition chamber.

21. The method of claim 20 wherein the emitting from the individual gas inlets is along respective lines which are parallel with respective global deposition surfaces of the respective individual wafers as received by the carrier within the one deposition chamber.

22. The method of claim 16 further comprising after the atomic layer depositing, moving the carrier with wafers into the transfer chamber and into another of the deposition chambers and atomic layer depositing a material onto the individual wafers received by the wafer carrier within the another deposition chamber.

23. An atomic layer deposition tool, comprising:
    a load chamber configured to receive a wafer carrier holding a plurality of semiconductor wafers;
    a transfer chamber connected with the load chamber and configured to receive the wafer carrier holding the plurality of semiconductor wafers; and a plurality of atomic layer deposition chambers connected with the transfer chamber and respectively individually configured to receive the wafer carrier holding the plurality of semiconductor wafers for collectively atomic layer depositing onto individual of said wafers.

24. The tool of claim 23 wherein the wafer carrier with the plurality of wafers received thereby occupies a loaded volume defined by a product of three maximum external linear dimensions of the carrier with the wafers, at least some of the atomic layer deposition chambers having respective internal volumes which are no greater than 125% of the loaded volume.

25. The tool of claim 23 wherein the wafer carrier with the plurality of wafers received thereby occupies a loaded volume defined by a product of three maximum external linear dimensions of the carrier with the wafers, at least some of the atomic layer deposition chambers having respective internal volumes which are no greater than 110% of the loaded volume.

26. The tool of claim 23 wherein the wafer carrier with the plurality of wafers received thereby occupies a loaded volume defined by a product of three maximum external linear dimensions of the carrier with the wafers, all of the atomic layer deposition chambers having respective internal volumes which are no greater than 110% of the loaded volume.

27. The tool of claim 23 wherein the wafer carrier holds no more than 200 wafers.

28. The tool of claim 23 wherein the wafer carrier holds no more than 100 wafers.

29. The tool of claim 23 wherein the wafer carrier holds no more than 50 wafers.

30. The tool of claim 23 wherein the wafer carrier holds no more than 25 wafers.

31. The tool of claim 23 wherein,
the wafer carrier with the plurality of wafers received thereby occupies a loaded volume defined by a product of three maximum external linear dimensions of the carrier with the wafers, at least some of the atomic layer deposition chambers having respective internal volumes which are no greater than 125% of the loaded volume; and
the wafer carrier holds no more than 50 wafers.

32. The tool of claim 23 further comprising within at least one of the atomic layer deposition chambers, individual deposition precursor gas inlets associated with respective individual of wafers received by the carrier when the carrier is received within the one atomic layer deposition chamber.

33. The tool of claim 32 wherein the individual gas inlets are also configured to emit purge gas.

34. The tool of claim 32 further comprising different individual purge gas inlets associated with respective individual of wafers received by the carrier when the carrier is received within the one atomic layer deposition chamber.

35. The tool of claim 32 wherein the individual gas inlets are configured to emit gas along respective lines which are parallel with respective global deposition surfaces of the respective individual wafers as received by the carrier within the one atomic layer deposition chamber.

36. The tool of claim 32 further comprising at least one individual deposition precursor gas inlet associated with each individual wafer when the carrier with wafers is received within the one atomic layer deposition chamber.

37. The tool of claim 36 wherein the individual gas inlets are configured to emit gas along respective lines which are parallel with respective global deposition surfaces of the respective individual wafers as received by the carrier within the one atomic layer deposition chamber.

38. The tool of claim 23 further comprising within at least one of the atomic layer deposition chambers, individual deposition precursor gas outlets associated with respective individual of wafers received by the carrier when the carrier is received within the one atomic layer deposition chamber.

39. The tool of claim 23 wherein the load chamber has an internal volume sized to receive a plurality of said wafer carriers.

\* \* \* \* \*